US010980104B1

(12) United States Patent
Tang-Kong

(10) Patent No.: US 10,980,104 B1
(45) Date of Patent: *Apr. 13, 2021

(54) CLAMPING SPRING DESIGN TO APPLY CLAMPING FORCE TO SMT POWER AMPLIFIER DEVICE

(71) Applicant: Panasonic Automotive Systems Company of America, Division of Panasonic Corporation of North America, Peachtree City, GA (US)

(72) Inventor: Gerald A. Tang-Kong, Newnan, GA (US)

(73) Assignee: Panasonic Automotive Systems Company of America, division of Panasonic Corporation of North America, Peachtree City, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/568,601

(22) Filed: Sep. 12, 2019

Related U.S. Application Data

(63) Continuation of application No. 15/679,919, filed on Aug. 17, 2017, now Pat. No. 10,455,686.

(60) Provisional application No. 62/376,939, filed on Aug. 19, 2016.

(51) Int. Cl.
| | | |
|---|---|---|
| *H05K 1/02* | (2006.01) | |
| *H03F 3/20* | (2006.01) | |
| *H05K 1/18* | (2006.01) | |
| *H03F 1/30* | (2006.01) | |

(52) U.S. Cl.
CPC ............ *H05K 1/0204* (2013.01); *H03F 1/30* (2013.01); *H03F 3/20* (2013.01); *H05K 1/181* (2013.01); *H03F 2200/447* (2013.01); *H05K 2201/066* (2013.01)

(58) Field of Classification Search
CPC ................. H05K 1/0204; H05K 1/181; H05K 2201/066; H05K 2201/10598; H03F 1/30; H03F 3/20; H03F 2200/447
See application file for complete search history.

(56) References Cited

U.S. PATENT DOCUMENTS

| | | | | |
|---|---|---|---|---|
| 6,618,253 | B1* | 9/2003 | Szu ..................... | H01L 23/4093 257/719 |
| 8,969,733 | B1* | 3/2015 | Mei ......................... | H05K 1/02 174/258 |
| 2005/0108877 | A1* | 5/2005 | Peterson ................. | B23P 11/00 29/890.03 |
| 2005/0195565 | A1* | 9/2005 | Bright .................... | H04B 1/036 361/688 |
| 2007/0097653 | A1* | 5/2007 | Gilliland ............... | H01L 23/552 361/719 |

(Continued)

*Primary Examiner* — Jacob R Crum
(74) *Attorney, Agent, or Firm* — Laurence S. Roach, Esq.

(57) ABSTRACT

A power amplifier arrangement for a motor vehicle includes a printed circuit board disposed between a housing on a first side of the printed circuit board and a heat sink on a second side of the printed circuit board. A power amplifier is mounted on the second side of the printed circuit board. A bracket is supported by the housing. A clamping spring is supported by the bracket such that the clamping spring is in biased engagement with the first side of the printed circuit board, and such that the power amplifier is pressed into engagement with the heat sink.

20 Claims, 3 Drawing Sheets

(56) References Cited

U.S. PATENT DOCUMENTS

| | | | |
|---|---|---|---|
| 2007/0211445 A1* | 9/2007 | Robinson | H01L 23/552 361/818 |
| 2008/0266799 A1* | 10/2008 | Campbell | G06F 1/20 361/699 |
| 2009/0034199 A1* | 2/2009 | Yu | H01L 23/4093 361/704 |
| 2015/0201525 A1* | 7/2015 | Tang-Kong | H01L 23/367 165/185 |

* cited by examiner

CLAMPING SPRING DESIGN TO APPLY CLAMPING FORCE TO SMT POWER AMPLIFIER DEVICE

CROSS-REFERENCED TO RELATED APPLICATIONS

This application is a continuation of U.S. patent application Ser. No. 15/679,919, filed on Aug. 17, 2017, which is currently under allowance, which claims benefit of U.S. Provisional Application No. 62/376,939 filed on Aug. 19, 2016, which the disclosure of which are hereby incorporated by reference in their entirety for all purposes.

FIELD OF THE INVENTION

The disclosure relates to applying a clamping force to a surface-mount technology (SMT) power amplifier device.

BACKGROUND OF THE INVENTION

It is known for a heat sink to be used to transfer heat away from a power amplifier. A problem is that if the power amplifier is not in very close contact with the heat sink, then the heat transfer from the power amplifier to the heat sink may be inefficient.

SUMMARY

The present invention may provide a high rate spring for applying clamping pressure between an SMT power amplifier device and a heat sink to improve heat transfer from the power amplifier to the heat sink.

In one embodiment, the invention comprises a power amplifier arrangement for a motor vehicle, including a printed circuit board disposed between a housing on a first side of the printed circuit board and a heat sink on a second side of the printed circuit board. A power amplifier is mounted on the second side of the printed circuit board. A bracket is supported by the housing. A clamping spring is supported by the bracket such that the clamping spring is in biased engagement with the first side of the printed circuit board, and such that the power amplifier is pressed into engagement with the heat sink.

In another embodiment, the invention comprises a power amplifier arrangement including a printed circuit board disposed between a housing on a first side of the printed circuit board and a heat sink on a second side of the printed circuit board. A power amplifier is mounted on the second side of the printed circuit board. A clamping spring exerts a force on the first side of the printed circuit board at a location opposite the power amplifier such that the power amplifier is biased against the heat sink.

In yet another embodiment, the invention comprises an electronic device arrangement for a motor vehicle including a printed circuit board disposed between a housing on a first side of the printed circuit board and a heat sink on a second side of the printed circuit board. An electronic device is mounted on the second side of the printed circuit board. A bracket is supported by the housing. A spring device is supported by the bracket such that the spring device exerts a force on an area of the first side of the printed circuit board that is opposite a location of the electronic device. The spring device exerts the force such that the electronic device is pressed into engagement with the heat sink.

An advantage of the invention is that the spring may enable assembly of the heat sink to the housing without any fixture to compress the spring.

BRIEF DESCRIPTION OF THE DRAWINGS

A better understanding of the present invention will be had upon reference to the following description in conjunction with the accompanying drawings.

DETAILED DESCRIPTION OF THE PREFERRED EMBODIMENTS

Figure 1:
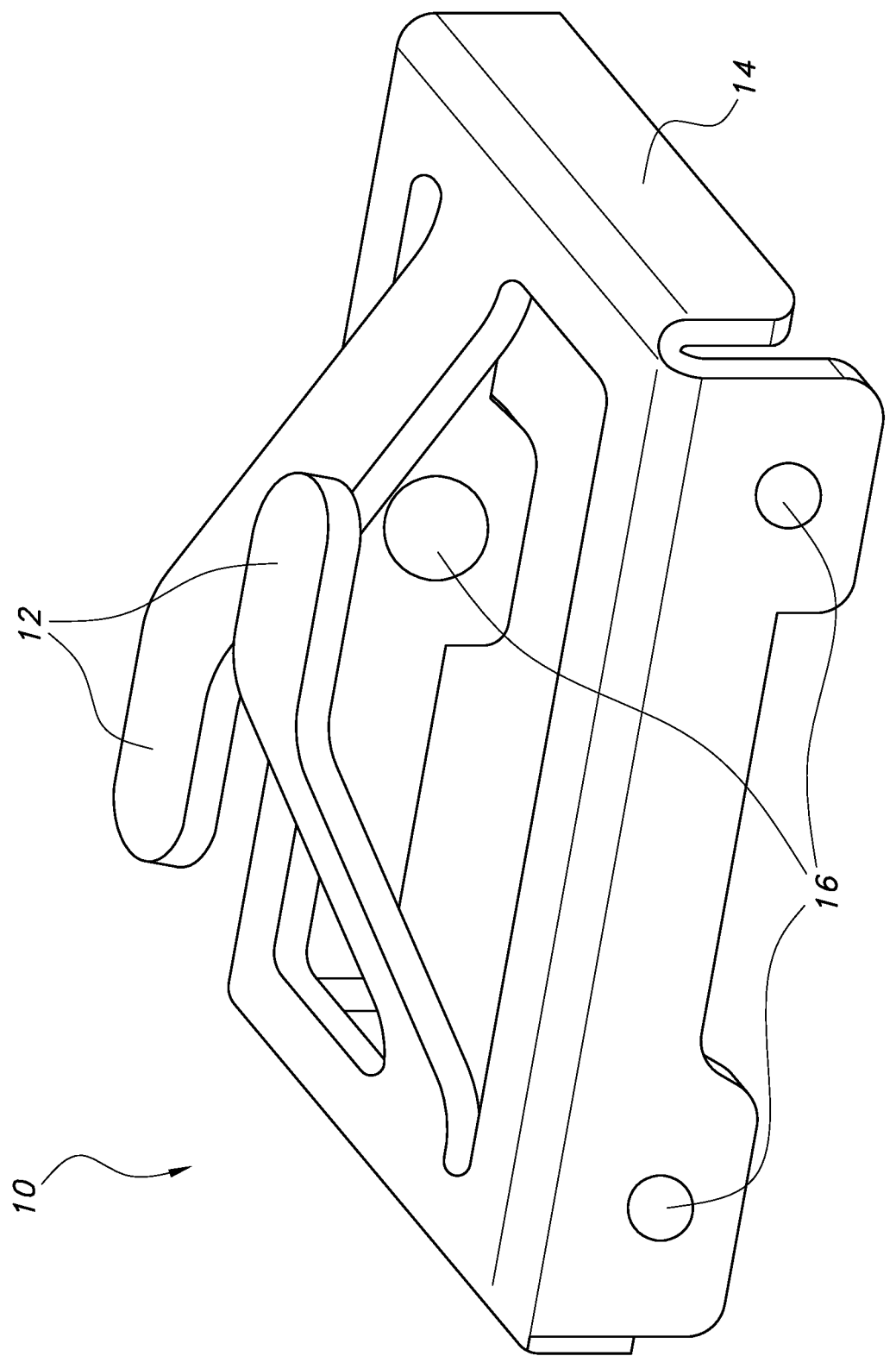
FIG. 1 is a perspective view of one example embodiment of a clamping spring of the present invention.

FIG. 1 illustrates one example embodiment of a clamping spring 10 of the present invention. Clamping spring 10 includes two leaf springs or spring fingers 12 and may be constructed of stainless steel material. Clamping spring 10 also includes a rectangular frame 14 having three retention features 16.

Clamping spring 10 is included in a power amplifier arrangement 11 (FIG. 2) wherein clamping spring 10 is assembled to the top of a clamping spring bracket 18 which is permanently attached to a bottom wall 19 of a housing 21. This bracket 18 serves to locate clamping spring 10 at the correct height to apply clamping force to the bottom surface of the printed circuit board (PCB) 22. Bracket 18 may engage retention features 16 such that bracket 18 retains clamping spring 10. For example, the innermost tips of retention features 16 may grip bracket 18 due to the width of bracket 18 being slightly larger than the distance in the width direction between opposing retention features 16 when clamping spring 10 is in the unbiased state.

The clamping force is applied to the bottom of PCB 22, and the top of PCB 22 is in turn pressed against a power amplifier 20. Power amplifier 20 is further pressed against heat sink 24, thus ensuring good contact between heat sink 24 and power amplifier 20, and good heat transfer from power amplifier 20 to heat sink 24.

Screws 26 secure heat sink 24 to housing 21. The spring free height (i.e., the height of spring 10 in an unbiased state) is such that the installation of screws 26 to attach heat sink 24 to housing 21 also compresses spring 10 to its installed height.

The spring rate of spring 10 is high enough to ensure that sufficient force is applied to the bottom of PCB 22 and is transferred to power amplifier 20 on the top of PCB 22 to provide sufficient clamping pressure. The force exerted by spring 10 may also be high enough to ensure that the physical integrity of arrangement 11 is not damaged by resonance frequencies in a high vibration environment.

Figure 2:
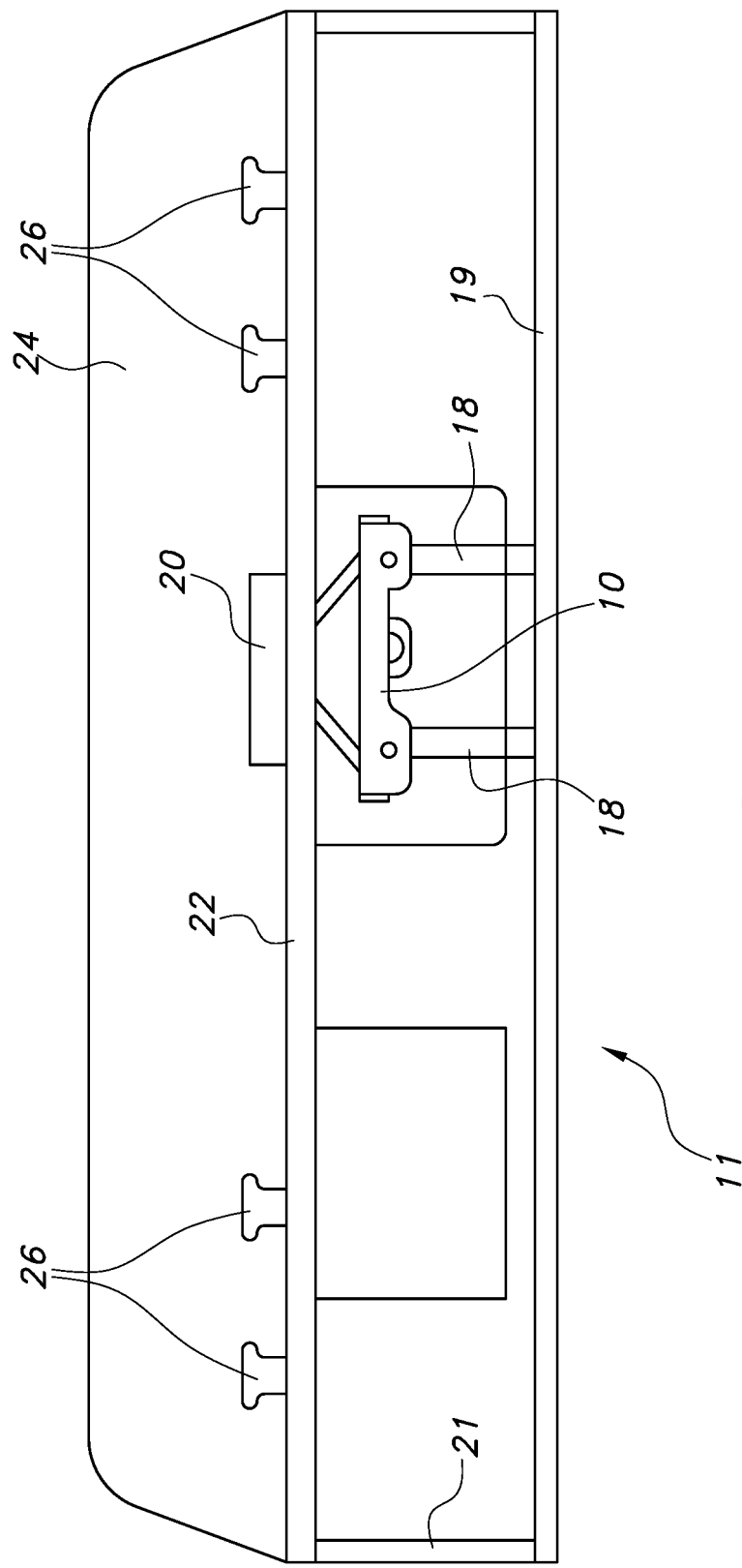
FIG. 2 is a front cross-sectional view of a power amplifier arrangement in which the clamping spring of FIG. 1 may be incorporated.
Figure 3:
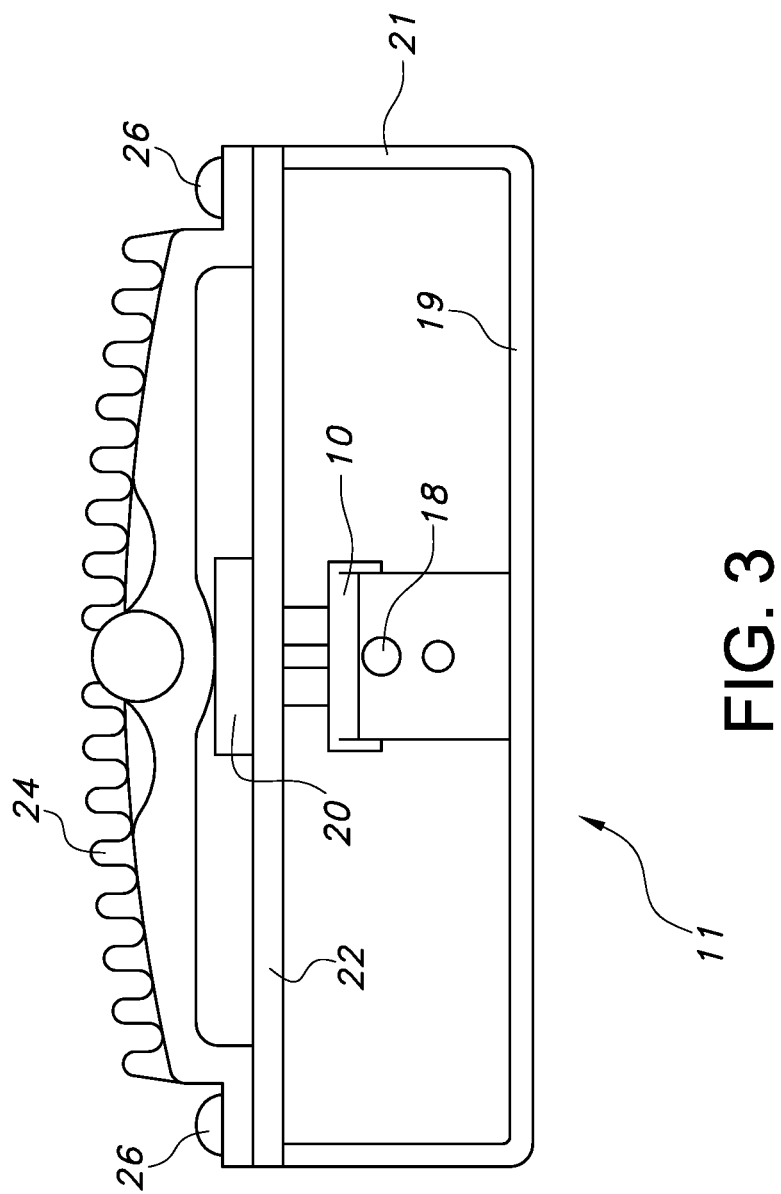
FIG. 3 is a side cross-sectional view of the power amplifier arrangement of FIG. 2.

While FIG. 2 illustrates a front cross-sectional view of power amplifier arrangement 11, FIG. 3 illustrates a side cross sectional view of power amplifier arrangement 11.

The inventive spring has been described as being applied to a SMT power amplifier. However, it is to be understood that it is within the scope of the invention for the spring to be applied to any SMT component, and to any electronic device.

The foregoing description may refer to "motor vehicle", "automobile", "automotive", or similar expressions. It is to be understood that these terms are not intended to limit the invention to any particular type of transportation vehicle. Rather, the invention may be applied to any type of transportation vehicle whether traveling by air, water, or ground, such as airplanes, boats, etc.

The foregoing detailed description is given primarily for clearness of understanding and no unnecessary limitations are to be understood therefrom for modifications can be made by those skilled in the art upon reading this disclosure and may be made without departing from the spirit of the invention.

What is claimed is:

1. An electronic arrangement for a motor vehicle, the arrangement comprising:
    a printed circuit board disposed between a support structure on a first side of the printed circuit board and a heat sink on a second side of the printed circuit board;
    an electronic component mounted on the second side of the printed circuit board; and
    a clamping spring supported by the support structure such that the clamping spring is in biased engagement with the first side of the printed circuit board, and such that the electronic component is pressed into engagement with the heat sink, the clamping spring including:
        a first leaf spring and a second leaf spring, the first and second leaf springs having substantially opposite orientations; and
        a rectangular frame having four walls including a first wall and a second wall, the first wall being opposite from the second wall, the first leaf spring being attached to only the first wall of the four walls and being unattached to all other things, the second leaf spring being attached to only the second wall of the four walls and being unattached to all other things.

2. The electronic of claim 1 wherein the clamping spring is supported by the support structure such that the clamping spring is in biased engagement with an area of the first side of the printed circuit board that is opposite the electronic component.

3. The electronic of claim 1 wherein the rectangular frame includes retention features for engaging the support structure.

4. The electronic arrangement of claim 3 wherein the retention features each have a semi-spherical shape.

5. The electronic arrangement of claim 1 further comprising a plurality of screws attaching the heat sink to the support structure.

6. The electronic arrangement of claim 1 wherein the first leaf spring cantilevers from the first wall of the frame, and the second leaf spring cantilevers from the second wall of the frame.

7. The electronic arrangement of claim 1 wherein the support structure includes a bracket supported by a housing.

8. The electronic arrangement of claim 1 wherein the electronic component comprises a surface-mount technology component.

9. The electronic arrangement of claim 1 wherein the electronic component comprises a power amplifier.

10. An electronic arrangement, the arrangement comprising:
    a printed circuit board disposed between a support structure on a first side of the printed circuit board and a heat sink on a second side of the printed circuit board;
    an electronic component mounted on the second side of the printed circuit board; and
    a clamping spring in biased engagement with the first side of the printed circuit board such that the electronic component is pressed into engagement with the heat sink, the clamping spring including:
        a first leaf spring and a second leaf spring, the first and second leaf springs having substantially opposite orientations; and
        a rectangular frame having four walls including a first wall and a second wall, the first wall being opposite from the second wall, the first leaf spring cantilevering from the first wall of the four walls, the second leaf spring cantilevering from the second wall of the four walls.

11. The electronic arrangement of claim 10 wherein the frame includes retention features for engaging the support structure.

12. The electronic arrangement of claim 11 wherein the retention features each have a semi-spherical shape.

13. The electronic arrangement of claim 10 further comprising a plurality of screws attaching the heat sink to the support structure.

14. The electronic arrangement of claim 10 wherein the electronic component comprises a power amplifier.

15. An electronic device arrangement for a motor vehicle, the arrangement comprising:
    a printed circuit board having a first side and a second side, and a heat sink on the second side of the printed circuit board;
    an electronic device mounted on the second side of the printed circuit board; and
    a spring device exerting a force on an area of the first side of the printed circuit board that is opposite a location of the electronic device, the spring device exerting the force such that the electronic device is pressed into engagement with the heat sink, the spring device including:
        a first leaf spring and a second leaf spring, the first and second leaf springs having substantially opposite orientations; and
        a rectangular frame having four walls including a first wall and a second wall, the first wall being opposite from the second wall, the first leaf spring being attached to only the first wall of the four walls, the second leaf spring being attached to only the second wall of the four walls.

16. The electronic device arrangement of claim 15 wherein the spring device is in biased engagement with an area of the first side of the printed circuit board that is opposite the electronic device.

17. The electronic device arrangement of claim 15 wherein the rectangular frame includes retention features for engaging a support structure that supports the spring device.

18. The electronic device arrangement of claim 17 wherein the retention features each have a semi-spherical shape.

19. The electronic device arrangement of claim 15 further comprising a plurality of screws attaching the heat sink to a support structure that supports the spring device.

20. The electronic device arrangement of claim 15 wherein the first leaf spring cantilevers from the first wall of the frame, and the second leaf spring cantilevers from the second wall of the frame.

* * * * *